United States Patent
Jang et al.

(10) Patent No.: US 8,576,637 B2
(45) Date of Patent: Nov. 5, 2013

(54) MEMORY MODULE INCLUDING MEMORY BUFFER AND MEMORY SYSTEM HAVING THE SAME

(75) Inventors: Soon-Deok Jang, Yongin-si (KR); Seok-Il Kim, Hwaseong-si (KR); Seung-Jin Seo, Suwon-si (KR); You-Keun Han, Yongin-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 280 days.

(21) Appl. No.: 12/959,504

(22) Filed: Dec. 3, 2010

(65) Prior Publication Data
US 2011/0176371 A1     Jul. 21, 2011

(30) Foreign Application Priority Data
Jan. 15, 2010   (KR) .................. 10-2010-0003815

(51) Int. Cl.
*G11C 7/10*       (2006.01)
(52) U.S. Cl.
USPC .................................................. 365/189.05
(58) Field of Classification Search
USPC .................................................. 365/189.05
See application file for complete search history.

(56) References Cited

U.S. PATENT DOCUMENTS

| | | | | |
|---|---|---|---|---|
| 5,892,777 | A * | 4/1999 | Nesheiwat et al. | 714/718 |
| 6,240,048 | B1 * | 5/2001 | Matsubara | 365/233.12 |
| 6,272,465 | B1 * | 8/2001 | Hewitt et al. | 704/258 |
| 6,347,063 | B1 * | 2/2002 | Dosaka et al. | 365/189.17 |
| 6,798,701 | B2 * | 9/2004 | Yamazaki | 365/189.05 |
| 7,088,835 | B1 * | 8/2006 | Norris et al. | 381/107 |
| 7,274,610 | B2 * | 9/2007 | Nanba | 365/201 |
| 7,289,383 | B2 | 10/2007 | Cornelius | |
| 7,492,661 | B2 * | 2/2009 | Yoshida et al. | 365/230.03 |
| 7,580,318 | B2 * | 8/2009 | Kim et al. | 365/230.08 |
| 2003/0214845 | A1 * | 11/2003 | Yamazaki | 365/189.04 |
| 2010/0257416 | A1 * | 10/2010 | Lee et al. | 714/718 |

FOREIGN PATENT DOCUMENTS

| | | |
|---|---|---|
| KR | 1020040026448 A | 3/2004 |
| KR | 1020060040396 A | 5/2006 |

* cited by examiner

*Primary Examiner* — Hoai V Ho
*Assistant Examiner* — Pablo Huerta
(74) *Attorney, Agent, or Firm* — Muir Patent Consulting, PLLC

(57) ABSTRACT

A memory buffer selecting between a parallel test mode and a mode register control mode, and a memory module and memory system having the memory buffer are disclosed. The memory buffer includes a control circuit and a mode selecting circuit. The control circuit generates a mode control signal based on a first chip selecting signal, a second chip selecting signal, a row address signal, a column address signal, and a write enable signal. The mode selecting circuit selects one of a parallel test mode and a mode register control mode in response to the mode control signal.

19 Claims, 7 Drawing Sheets

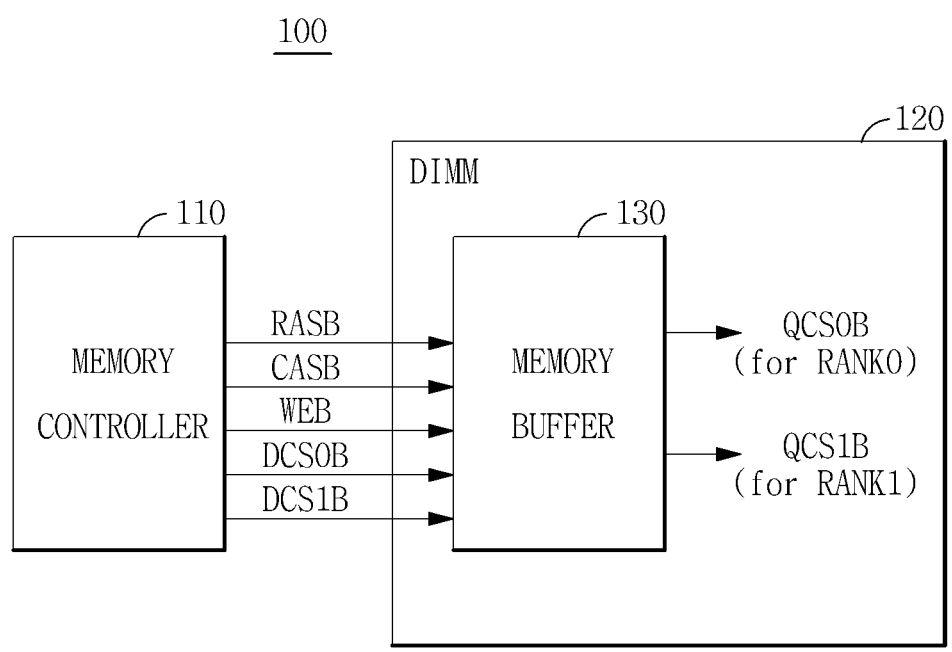

FIG. 3

| COMMAND | INPUT | | | | | OUTPUT | |
|---|---|---|---|---|---|---|---|
| | DCS0B | DCS1B | RASB | CASB | WEB | QCS0B | QCS1B |
| CMR | E | E | D | D | D | D | D |
| (E)MRS LEVELING | E | E | E | E | E | E | E |
| ZQCAL | E | E | D | D | E | E | E |
| ACT | E | E | E | D | D | E | E |
| WR | E | E | D | E | E | E | E |
| RD | E | E | D | E | D | E | E |
| PRE | E | E | E | D | E | E | E |

The mode in which a parallel test is possible

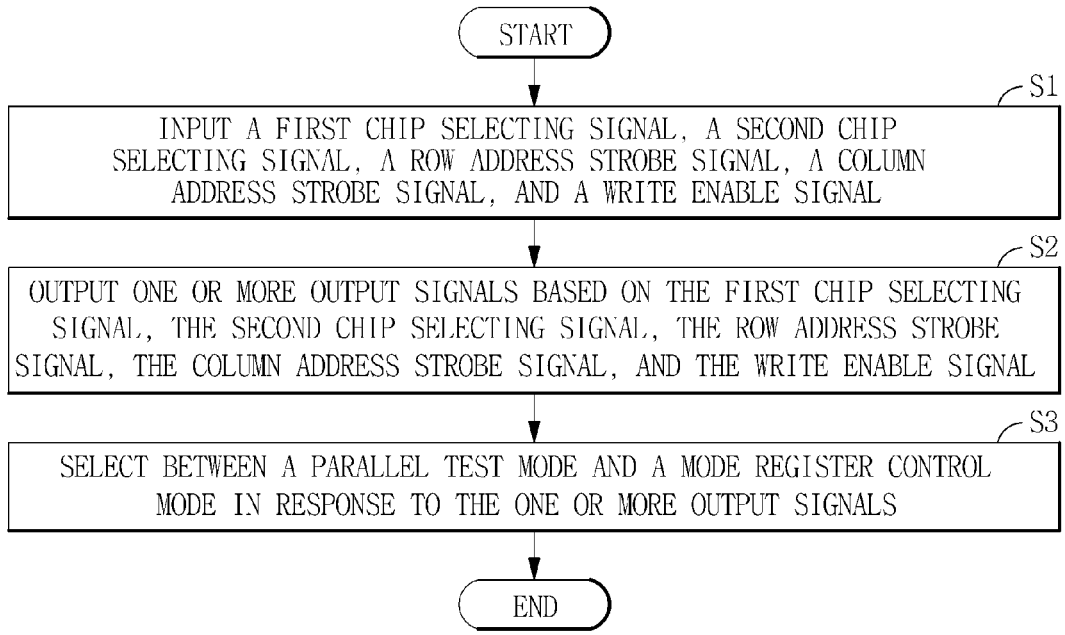
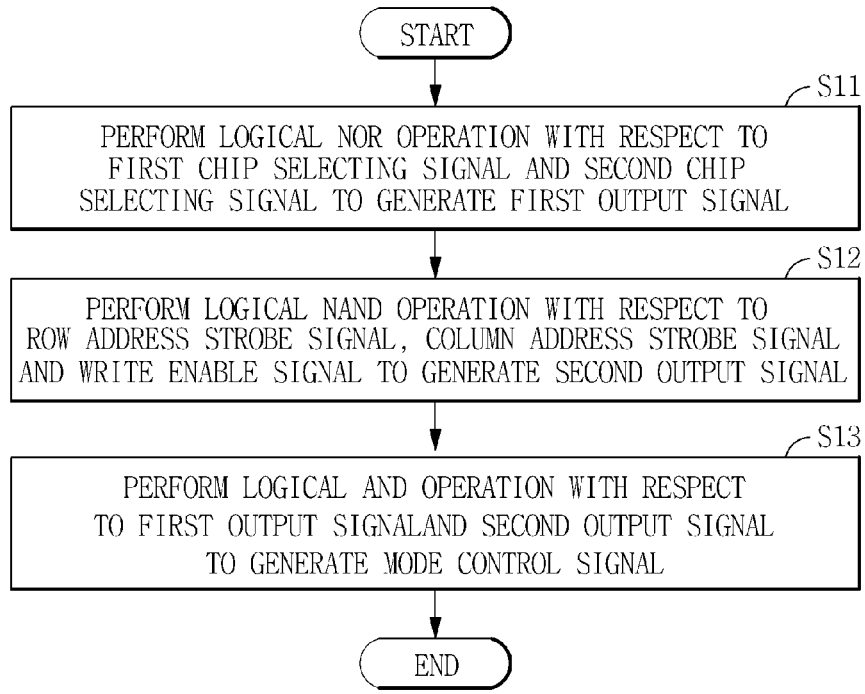

MEMORY MODULE INCLUDING MEMORY BUFFER AND MEMORY SYSTEM HAVING THE SAME

CROSS-REFERENCE TO RELATED APPLICATIONS

This application claims priority under 35 U.S.C. §119 to Korean Patent Application No. 10-2010-0003815 filed on Jan. 15, 2010, the disclosure of which is hereby incorporated by reference in its entirety.

BACKGROUND

1. Field

The embodiments disclosed in this application relate to a memory system, and particularly to a memory system that includes a memory module on which a memory buffer is mounted, and a method of setting a mode of the memory module.

2. Description of Related Art

Semiconductor memory devices are used to store data in a variety of electronic products and applications. A memory module including a substrate and a plurality of semiconductor memory devices mounted on the substrate is typically used in electronic products, such as computers.

Recently, certain types of memory modules include a memory buffer for buffering a signal and data received from the exterior and to provide the signal and/or data to semiconductor memory devices mounted on the memory module. In a memory module on which semiconductor memory devices such as double data rate 3 (DDR3) are mounted, a function of mode register control is included in the memory buffer, and the memory module controls output signals of the memory buffer variously. For example, the mode register control signal (CMR) may control a magnitude or delay time of a signal.

In these systems, however, it is typically difficult for a memory module including semiconductor memory devices having a function of mode register control (CMR) to enter into certain other modes, such as a parallel test mode for a memory module that has a plurality of ranks.

SUMMARY

Embodiments disclosed herein provide a memory buffer that selectively generates a parallel test mode and a mode register control mode.

Embodiments also provide a memory module having the memory buffer.

Embodiments also provide a memory system having the memory buffer.

Embodiments additionally provide a method of setting a mode of a memory module that selectively chooses a parallel test mode and a mode register control mode.

The technical objectives of the disclosed embodiments are not limited to the above disclosure; other objectives may become apparent to those of ordinary skill in the art based on the following descriptions.

In one embodiment, a memory buffer includes a control circuit and a mode selecting circuit. The control circuit generates a mode control signal based on a first chip selecting signal, a second chip selecting signal, a row address strobe signal, a column address strobe signal, and a write enable signal. The mode selecting circuit selects one of a parallel test mode and a mode register control mode in response to the mode control signal.

In some embodiments, the memory buffer may enter the parallel test mode when the first chip selecting signal and the second chip selecting signal are enabled, and the row address strobe signal, the column address strobe signal, or the write enable signal is enabled.

In some embodiments, output signals of the memory buffer corresponding to the first chip selecting signal and the second chip selecting signal may be enabled in the parallel test mode.

In some embodiments, the memory buffer may enter the mode register control mode when the first chip selecting signal and the second chip selecting signal are enabled, and the row address strobe signal, the column address strobe signal, and the write enable signal are disabled.

In some embodiments, output signals of the memory buffer corresponding to the first chip selecting signal and the second chip selecting signal may be disabled in the mode register control mode.

In some embodiments, the memory buffer may enter the parallel test mode when the first chip selecting signal and the second chip selecting signal are enabled, and output signals of the memory buffer corresponding to the first chip selecting signal and the second chip selecting signal are enabled.

In some embodiments, the memory buffer may enter the mode register control mode when the first chip selecting signal and the second chip selecting signal are enabled, and output signals of the memory buffer corresponding to the first chip selecting signal and the second chip selecting signal are disabled.

In some embodiments, the control circuit may include a NOR gate, a NAND gate and an AND gate. The NOR gate may perform a logical NOR operation with respect to the first chip selecting signal and the second chip selecting signal. The NAND gate may perform a logical NAND operation with respect to the row address strobe signal, the column address strobe signal and the write enable signal. The AND gate may perform a logical AND operation with respect to an output signal of the NOR gate and an output signal of the NAND gate to generate the mode control signal.

In some embodiments, the memory buffer may include at least one register for buffering data.

In some embodiments, the memory buffer may have a function of a buffer and a function of a clock generator.

In another embodiment, a memory module includes a substrate, a plurality of semiconductor memory devices and a memory buffer. Each of the semiconductor memory devices may be mounted on a surface of the substrate and may operate in response to a command and an address signal and a data signal. The memory buffer selects a mode from modes including a parallel test mode and a mode register control mode based at least on a first chip selecting signal and a second chip selecting signal In some embodiments, the memory module may include a plurality of ranks which are tested simultaneously in the parallel test mode.

In another embodiment, a memory system includes a memory controller, a memory buffer and a memory module. The memory controller generates a first chip selecting signal, a second chip selecting signal, a row address strobe signal, a column address strobe signal, and a write enable signal. The memory buffer generates a mode control signal based on the first chip selecting signal, the second chip selecting signal, the row address strobe signal, the column address strobe signal, and the write enable signal, and selects a mode from modes including a parallel test mode and a mode register control mode in response to the mode control signal. The memory module includes semiconductor memory devices that operate in response to the parallel test mode and the mode register control mode.

In accordance with yet another embodiment, a method of setting a mode of a memory module includes inputting a first chip selecting signal, a second chip selecting signal, a row address strobe signal, a column address strobe signal, and a write enable signal to a logic circuit, outputting one or more output signals from the logic circuit, based on the first chip selecting signal, the second chip selecting signal, the row address strobe signal, the column address strobe signal, and the write enable signal, and selecting between a parallel test mode and a mode register control mode in response to the one or more output signals.

In some embodiments, the generating of one or more output signals includes outputting a mode control signal generated by performing a logical NOR operation with respect to the first chip selecting signal and the second chip selecting signal to generate a first output signal, performing a logical NAND operation with respect to the row address strobe signal, the column address strobe signal, and the write enable signal to generate a second output signal, and performing a logical AND operation with respect to the first output signal and the second output signal to generate the mode control signal.

A memory buffer in accordance with the disclosed embodiments may selectively choose a parallel test mode and a mode register control mode according to logic states of chip selecting signals, a row address strobe signal, a column address strobe signal and a write enable signal. Therefore, a memory system including the memory buffer in accordance with the disclosed embodiments may have a short test time because a memory module having a plurality of ranks are tested simultaneously in the memory system having the mode register control mode.

BRIEF DESCRIPTION OF THE DRAWINGS

The foregoing and other features and advantages described herein will be apparent from the more particular description of the disclosed embodiments, as illustrated in the accompanying drawings in which like reference characters refer to like parts throughout the different views. The drawings are not necessarily to scale, emphasis instead being placed upon illustrating the principles of the disclosed embodiments. In the drawings:

FIG. 1 is a block diagram illustrating an exemplary memory system in accordance with certain exemplary embodiments;

FIG. 2 is a table illustrating examples of operation modes of the memory system according to logic states of input signals and output signals of a memory buffer included in the memory system of FIG. 1, according to certain embodiments;

FIG. 3 is an exemplary table illustrating definitions of the commands used in the memory system of FIG. 1 using logic states of input signals and output signals of a memory buffer included in the memory system of FIG. 1, according to certain embodiments;

FIG. 7 is a flowchart illustrating an exemplary method of setting a mode of a memory module in accordance with certain embodiments;

FIG. 8 is an exemplary flowchart illustrating a process of generating a mode control signal in accordance with the method of FIG. 7, according to one embodiment.

DETAILED DESCRIPTION

Figure 4:
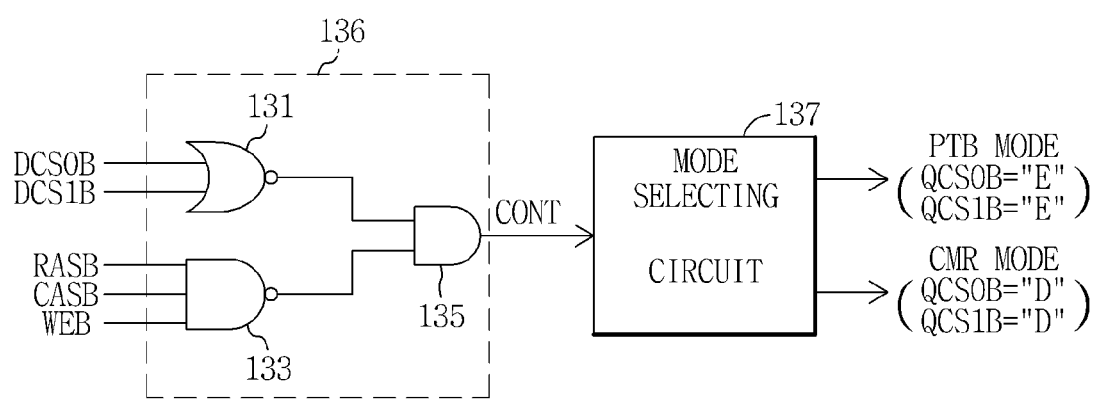
FIG. 4 is a circuit diagram illustrating an example of a circuit included in the memory buffer included in the memory system of FIG. 1, according to certain embodiments.

Various embodiments will now be described more fully with reference to the accompanying drawings in which some embodiments are shown. These present disclosure may, however, be embodied in different forms and should not be construed as limited to the embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an exemplary memory system 100 in accordance with certain disclosed embodiments.

Referring to FIG. 1, the memory system 100 includes a memory controller 110, a memory module 120 and a memory buffer 130 connected to (e.g., mounted on the surface of) the memory module 120.

In one embodiment, the memory controller 110 generates a first chip selecting signal DCS0B, a second chip selecting signal DCS1B, a row address strobe signal RASB, a column address strobe signal CASB, and a write enable signal WEB, which are transmitted from memory controller 110 to memory buffer 130. Memory controller 110 may also transmit other signals, such as an address signal, a command signal, and/or a data signal, to memory buffer 130, though those are not shown in FIG. 1. The memory buffer 130 selectively chooses a mode from among modes including a parallel test mode and a mode register control mode, based on the first chip selecting signal DCS0B, the second chip selecting signal DCS1B, the row address strobe signal RASB, the column address strobe signal CASB, and the write enable signal WEB (e.g., it generates one or more signals, such as a mode control signal, that indicate the selected mode). Memory buffer 130 may also generate other signals, such as an address signal and data signal, based on input address signal and data signal, and may generate command signals based on respective signals RASB, CASB, and WEB. The memory module 120 also includes semiconductor memory devices that operate in response to the parallel test mode and the mode register control mode.

In symbols of the signals shown in FIG. 1, "B" denotes a negation. For example, RASB denotes a signal having a logic state opposite to RAS. In other words, the row address strobe signal RASB may be a signal that is enabled in a logic low state.

In FIG. 1, the selection of the parallel test mode or the mode register control mode is determined according to logic states of output signals QSC0B and QSC1B of the memory buffer 130. For example, the memory module 120 may operate in the parallel test mode when both QSC0B and QSC1B have enable states, and may operate in the mode register control mode when both QSC0B and QSC1B have disable states. In the parallel test mode, QSC0B may activate a first rank RANK0 of the memory module 120 and QSC1B may activate a second rank RANK1 of the memory module 120.

FIG. 2 is a table illustrating examples of operation modes of the memory system according to logic states of input signals and output signals of the memory buffer 130 included in the memory system 100 of FIG. 1, according to certain exemplary embodiments.

Referring to FIG. 2, the memory module 120 is disabled when the first chip selecting signal DCS0B has a disable state D, the second chip selecting signal DCS1B has the disable state D, a first output signal QCS0B of the memory buffer 130 has the disable state D, and a second output signal QCS1B of the memory buffer 130 has the disable state D. The memory module 120 operates in a normal mode NORMAL when the first chip selecting signal DCS0B has the disable state D, the second chip selecting signal DCS1B has an enable state E, the first output signal QCS0B of the memory buffer 130 has the disable state D, and the second output signal QCS1B of the memory buffer 130 has the enable state E. Further, the memory module 120 operates in the normal mode NORMAL when the first chip selecting signal DCS0B has the enable state E, the second chip selecting signal DCS1B has a disable state D, the first output signal QCS0B of the memory buffer 130 has the enable state E, and the second output signal QCS1B of the memory buffer 130 has the disable state D. The memory module 120 operates in the mode register control mode (CMR) when the first chip selecting signal DCS0B has the enable state E, the second chip selecting signal DCS1B has the enable state E, the first output signal QCS0B of the memory buffer 130 has the disable state D, and the second output signal QCS1B of the memory buffer 130 has the disable state D. The memory module 120 operates in the parallel test mode (PTB) when the first chip selecting signal DCS0B has the enable state E, the second chip selecting signal DCS1B has the enable state E, the first output signal QCS0B of the memory buffer 130 has the enable state E, and the second output signal QCS1B of the memory buffer 130 has the enable state E.

FIG. 3 is a table illustrating definitions of the commands used in the memory system of FIG. 1 using logic states of input signals and output signals of a memory buffer included in the memory system of FIG. 1, according to certain exemplary embodiments.

Referring to FIG. 3, a command of the mode register control mode CMR is enabled and in this condition the operation mode is defined as the mode register control mode CMR when the first chip selecting signal DCS0B has the enable state E, the second chip selecting signal DCS1B has the enable state E, the row address strobe signal RASB has the disable state D, the column address strobe signal CASB has the disable state D, the write enable signal WEB has the disable state D, the first output signal QCS0B of the memory buffer 130 has the disable state D, and the second output signal QCS1B of the memory buffer 130 has the disable state D. A command of a mode register set (MRS) or a command of leveling is enabled when the first chip selecting signal DCS0B has the enable state E, the second chip selecting signal DCS1B has the enable state E, the row address strobe signal RASB has the enable state E, the column address strobe signal CASB has the enable state E, the write enable signal WEB has the enable state E, the first output signal QCS0B of the memory buffer 130 has the enable state E, and the second output signal QCS1B of the memory buffer 130 has the enable state E. The command of MRS or a command of extended MRS (EMRS) is a command used to set operation modes of the semiconductor memory devices mounted on the memory module. The command of leveling is a command used to fit the clock signal CLOCK to an edge of a data strobe signal DQS.

A command of an output impedance calibration ZQCAL is enabled when the first chip selecting signal DCS0B has the enable state E, the second chip selecting signal DCS1B has the enable state E, the row address strobe signal RASB has the disable state D, the column address strobe signal CASB has the disable state D, the write enable signal WEB has the enable state E, the first output signal QCS0B of the memory buffer 130 has the enable state E, and the second output signal QCS1B of the memory buffer 130 has the enable state E.

An active command ACT is enabled when the first chip selecting signal DCS0B has the enable state E, the second chip selecting signal DCS1B has the enable state E, the row address strobe signal RASB has the enable state E, the column address strobe signal CASB has the disable state D, the write enable signal WEB has the disable state D, the first output signal QCS0B of the memory buffer 130 has the enable state E, and the second output signal QCS1B of the memory buffer 130 has the enable state E.

A write command WR is enabled when the first chip selecting signal DCS0B has the enable state E, the second chip selecting signal DCS1B has the enable state E, the row address strobe signal RASB has the disable state D, the column address strobe signal CASB has the enable state E, the write enable signal WEB has the enable state E, the first output signal QCS0B of the memory buffer 130 has the enable state E, and the second output signal QCS1B of the memory buffer 130 has the enable state E.

A read command RD is enabled when the first chip selecting signal DCS0B has the enable state E, the second chip selecting signal DCS1B has the enable state E, the row address strobe signal RASB has the disable state D, the column address strobe signal CASB has the enable state E, the write enable signal WEB has the disable state D, the first output signal QCS0B of the memory buffer 130 has the enable state E, and the second output signal QCS1B of the memory buffer 130 has the enable state E.

A pre-charge command PRE is enabled when the first chip selecting signal DCS0B has the enable state E, the second chip selecting signal DCS1B has the enable state E, the row address strobe signal RASB has the enable state E, the column address strobe signal CASB has the disable state D, the write enable signal WEB has the enable state E, the first output signal QCS0B of the memory buffer 130 has the enable state E, and the second output signal QCS1B of the memory buffer 130 has the enable state E. The memory module 120 can be operated according to the above commands, and based on a number of signals, including address signals, command signals, and DCS0B and DCS1B signals.

The memory system 100 enters a corresponding operation mode when each of the commands shown in the table of FIG. 3 is enabled. For example, the memory system 100 may enter a write operation mode when the write command WR is enabled. In the table of FIG. 3, the parallel test may be performed in the operation modes MRS, LEVELING, ZQCAL, ACT, WR, RD and PRE, excluding the mode register control mode CMR. That is, as shown in FIG. 2, the parallel test of the memory module 120 may be performed when the first chip selecting signal DCS0B has the enable state E, the second chip selecting signal DCS1B has the enable state E, the first output signal QCS0B of the memory buffer 130 has the enable state E, and the second output signal QCS1B of the memory buffer 130 has the enable state E.

FIG. 4 is a circuit diagram illustrating an example of a circuit 130a in a memory buffer 130 included in the memory system 100 of FIG. 1. In FIG. 4, only the circuit for setting an operation mode which is a part of the memory buffer 130 is shown, but the memory buffer 130 may include one or more registers that receive command signals, data signals, and address signals from the memory controller 110 and buffer the received data, commands, and addresses to provide them to semiconductor memory devices (not shown) mounted on the memory module 120, and may include other elements as well. The memory buffer 130 may have a function of a buffer and also a function of a clock generator.

Referring to FIG. 4, the circuit 130a (also referred to as a "selection circuit") includes a control circuit 136 and a mode selecting circuit 137. The control circuit 136 generates a mode control signal CONT based on a first chip selecting signal DCS0B, a second chip selecting signal DCS1B, a row address strobe signal RASB, a column address strobe signal CASB, and a write enable signal WEB. The mode selecting circuit 137 selectively generates output signals that indicate a parallel test mode PTB or a mode register control mode CMR in response to the mode control signal CONT.

For example, the mode selecting circuit 137 may generate signals indicating the parallel test mode PTB when the mode control signal CONT has a logic high state, and may generate signals indicating the mode register control mode CMR when the mode control signal CONT has a logic low state. Both of the first chip selecting signal DCS0B and the second chip selecting signal DCS1B may have the enable state E in the parallel test mode PTB, and both of the first chip selecting signal DCS0B and the second chip selecting signal DCS1B may have the disable state D in the mode register control mode CMR.

In one embodiment, the control circuit 136 may be a logic circuit that includes a NOR gate 131, a NAND gate 133 and an AND gate 135.

The NOR gate 131 performs a logical NOR operation with respect to the first chip selecting signal DCS0B and the second chip selecting signal DCS1B, which are inputs to the NOR gate. The NAND gate 133 performs a logical NAND operation with respect to the row address strobe signal RASB, the column address strobe signal CASB, and the write enable signal WEB, which are inputs to the NAND gate. The AND gate 135 performs a logical AND operation with respect to an output signal of the NOR gate 131 and an output signal of the NAND gate 133 to generate one or more output signals, such as the mode control signal CONT.

Mode selecting circuit 137 may be a circuit including logic and/or other elements, that output, for example, signals QCS0B and QCS1B, based on an input of the mode control signal CONT, as described above.

The selection circuit 130a may cause the memory buffer to enter the parallel test mode PTB when the first chip selecting signal DCS0B and the second chip selecting signal DCS1B have the enable state E, and the row address strobe signal RASB, the column address strobe signal CASB, or the write enable signal WEB has the enable state E.

The selection circuit 130a may cause the memory buffer to enter the mode register control mode CMR when the first chip selecting signal DCS0B and the second chip selecting signal DCS1B have the enable state E, and the row address strobe signal RASB, the column address strobe signal CASB, and the write enable signal WEB have the disable state D.

Figure 5:
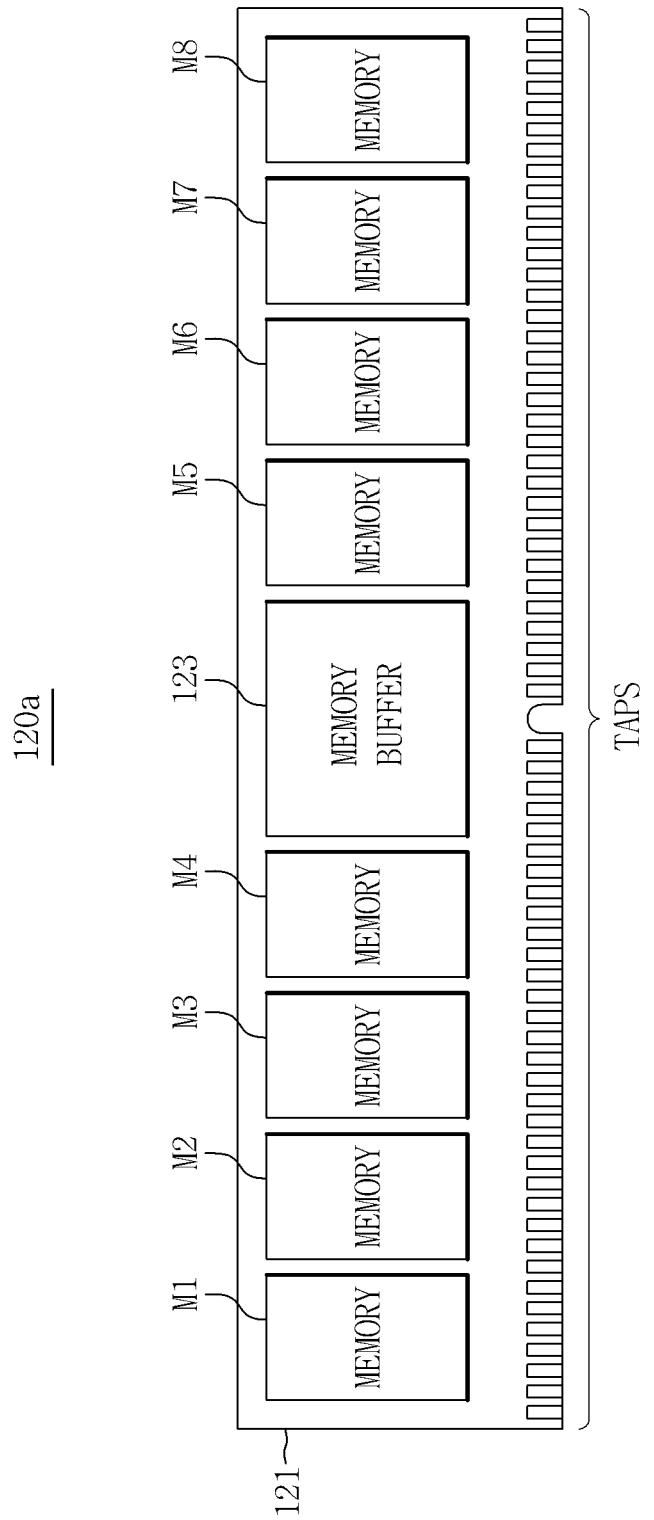
FIG. 5 is an exemplary plan view of a memory module including a memory buffer in accordance with certain embodiments.

FIG. 5 is a plan view of an exemplary memory module including a memory buffer in accordance with embodiments of the disclosure. The memory module 120*a* of FIG. 5 may be a dual-in-line memory module (DIMM) including a memory buffer that buffers data input to or output from semiconductor memory devices.

Referring to FIG. 5, the memory module 120*a* may include semiconductor memory devices M1 to M8 and a memory buffer 123 arranged on a printed circuit board (PCB) 121. In the plan view of FIG. 5, although only eight semiconductor memory devices M1 to M8 arranged on the top surface of the printed circuit board (PCB) 121 are shown, the memory module 120*a* may also, or alternatively, include eight semiconductor memory devices arranged on the bottom surface of the printed circuit board (PCB) 121, and/or may include greater than or fewer than eight semiconductor memory devices on each surface of the PCB 121. In one embodiment, the memory buffer 123 has the same structure as the memory buffer 130 shown in FIG. 1.

The memory buffer 123 not only buffers data and addresses but also generates a mode control signal based on the first chip selecting signal DCS0B and the second chip selecting signal DCS1B, the row address strobe signal RASB, the column address strobe signal CASB and the write enable signal WEB, and selects one of a parallel test mode and a mode register control mode in response to the mode control signal. The semiconductor memory devices mounted on the memory module 120 operate in response to the parallel test mode and the mode register control mode.

A plurality of module taps TAPS arranged on the PCB 121 function as a path that transmits and receives signals between the memory module and external devices. In the memory module of FIG. 5, buses through which signals are transmitted are not shown. Each of the semiconductor memory devices M1 to M8 are mounted on the surface of the PCB 121, and may operate in response to a command signal, address signal, and/or data signal.

Figure 6:
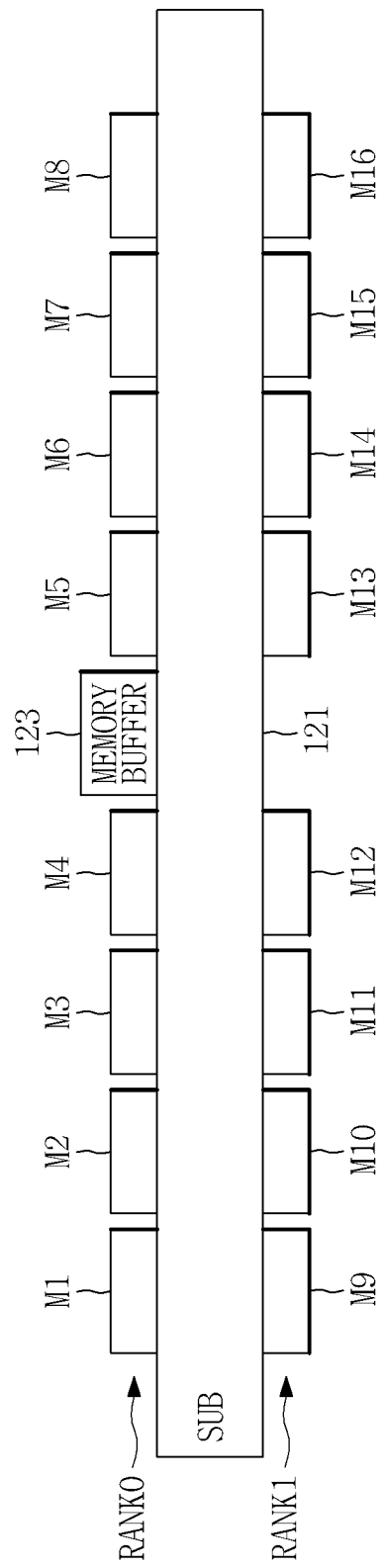
FIG. 6 is an exemplary cross-sectional view of the memory module shown in FIG. 5, according to certain embodiments.

FIG. 6 is an exemplary cross-sectional view of the memory module 120*a* shown in FIG. 5, according to one embodiment.

Referring to FIG. 6, the memory module 120*b* includes a plurality of semiconductor memory devices on both sides of a substrate 121. Semiconductor memory devices M1 to M8 and a memory buffer 123 are included on a top surface of the memory module 120*b* and semiconductor memory devices M9 to M16 are included on a bottom surface of the memory module 120*b*. Fewer or additional semiconductor memory devices may be included.

In FIG. 6, although the memory buffer 123 is show as being mounted on the top surface of the substrate 121, the memory buffer 123 may be alternatively mounted on the bottom surface of the substrate 121. Further, the memory buffer 123 may be mounted on the top surface and the bottom surface of the substrate 121.

As described above referring to FIGS. 1 to 6, the memory buffer 130 of the memory system 100 is mounted on the memory module 120, and selectively generates the parallel test mode PTB and the mode register control mode CMR based on chip selecting signals, the row address strobe signal RASB, the column address strobe signal CASB, and the write enable signal WEB.

Therefore, the memory system 100 may enter the parallel test mode PTB using a combination of logic states of the chip selecting signals, the row address strobe signal RASB, the column address strobe signal CASB and the write enable signal WEB even though the memory buffer 130 of the memory system 100 can alternatively select the mode register control mode CMR. That is, the memory system in accordance with the disclosed embodiments may simultaneously test ranks comprising the memory module, and the memory buffer 130 may also include the mode register control mode CMR. Therefore, the test time of the memory system including a memory buffer in accordance with embodiments disclosed herein may be decreased.

FIG. 7 is a flowchart illustrating an exemplary method of setting a mode of a memory module in accordance with embodiments of the disclosure.

Referring to FIG. 7, an exemplary method of setting a mode of a memory module includes the following steps.

1) Inputting a first chip selecting signal, a second chip selecting signal, a row address strobe signal, a column address strobe signal, and a write enable signal to a logic circuit (S1).

2) Outputting one or more output signals from the logic circuit, based on the first chip selecting signal, the second chip selecting signal, the row address strobe signal, the column address strobe signal, and the write enable signal (S2).

3) Selecting between a parallel test mode or a mode register control mode in response to the one or more output signals (S3).

FIG. 8 is a flowchart illustrating an exemplary process of generating the one or more output signals, including a mode control signal, shown in the flowchart of FIG. 7, according to one embodiment.

Referring to FIG. 8, the process of generating a mode control signal of the method of setting a mode of a memory module may include the following steps.

1) Perform a logical NOR operation with respect to the first chip selecting signal and the second chip selecting signal to generate a first output signal (S11).

2) Perform a logical NAND operation with respect to the row address strobe signal, the column address strobe signal, and the write enable signal to generate a second output signal (S12).

3) Perform a logical AND operation with respect to the first output signal and the second output signal to generate the mode control signal (S13).

As described above referring to FIGS. 1 to 6, in the method of setting a mode of a memory module, the memory module may enter the parallel test mode when the first chip selecting signal and the second chip selecting signal are enabled, and the row address strobe signal, the column address strobe signal, or the write enable signal is enabled. Further, in the method of setting a mode of a memory module, the memory module may enter the mode register control mode when the first chip selecting signal and the second chip selecting signal are enabled, and the row address strobe signal, the column address strobe signal, and the write enable signal are disabled.

Figure 9:
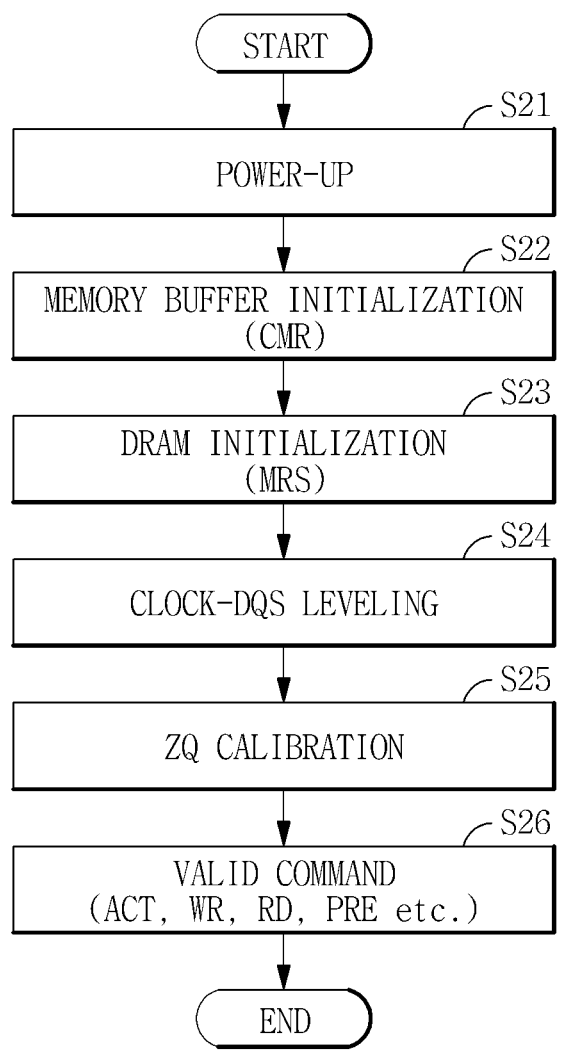
FIG. 9 is an exemplary flowchart illustrating a process of initial operation of the memory system shown in FIG. 1, in accordance with certain embodiments.

FIG. 9 is an exemplary flowchart illustrating a process of initial operation of the memory system shown in FIG. 1, according to one embodiment.

Referring to FIG. 9, the process of initial operation of the memory system may include the following steps.

1) Apply a power supply to a memory system (S21).

2) Initialize a memory buffer mounted on a memory module (S22). At this time, a mode register control command CMR is enabled.

3) Initialize semiconductor memory devices mounted on the memory module (S23). At this time, an MRS signal is enabled.

4) Enable a leveling command used to fit a clock signal CLOCK to an edge of a data strobe signal DQS (S24).

5) Enable a command of an output impedance calibration ZQCAL (S25).

6) Enable an active command ACT, a write command WR, a read command RD, and a pre-charge command PRE (S26).

In the step of initializing a memory buffer mounted on the memory module (S22), when the first chip selecting signal DCS0B has the enable state E, the second chip selecting signal DCS1B has the enable state E, the row address strobe signal RASB has the disable state D, the column address strobe signal CASB has the disable state D, and the write enable signal WEB has the disable state D, the first output signal QCS0B and the second output signal QCS1B of the memory buffer 130 have the disable state D and a command of the mode register control mode CMR is enabled. In this condition, the memory system enters the mode register control mode CMR.

After the step of initializing semiconductor memory devices mounted on the memory module (S23), when the first chip selecting signal DCS0B and the second chip selecting signal DCS1B have the enable state E, and the row address strobe signal RASB, the column address strobe signal CASB, or the write enable signal WEB has the disable state D, the first output signal QCS0B and the second output signal QCS1B of the memory buffer 130 have the enable state E, and in this condition the memory system may enter the parallel test mode PTB.

In the method embodiments described above, although certain steps are described in a particular order, they need not occur in the described order. For example, certain steps may occur at the same time as other steps, or in a different order. In addition, in the above, a memory module having two ranks is mainly described, but the memory buffer in accordance with disclosed embodiments may be applied to a memory module having a plurality of ranks.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of the invention as defined in the claims. In the claims, any means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A memory buffer, comprising:
   a control circuit configured to generate a mode control signal based on a first chip selecting signal and a second chip selecting signal received simultaneously, and a row address strobe signal, a column address strobe signal, and a write enable signal received simultaneously; and
   a mode selecting circuit configured to select one of a parallel test mode and a mode register control mode in response to the mode control signal.

2. The memory buffer of claim 1, wherein the memory buffer is configured to enter the parallel test mode when the first chip selecting signal and the second chip selecting signal are enabled, and the row address strobe signal, the column address strobe signal, or the write enable signal is enabled.

3. The memory buffer of claim 2, wherein output signals of the memory buffer corresponding to the first chip selecting signal and the second chip selecting signal are configured to be enabled in the parallel test mode.

4. The memory buffer of claim 1, wherein the memory buffer is configured to enter the mode register control mode when the first chip selecting signal and the second chip selecting signal are enabled, and the row address strobe signal, the column address strobe signal, and the write enable signal are disabled.

5. The memory buffer of claim 4, wherein output signals of the memory buffer corresponding to the first chip selecting signal and the second chip selecting signal are configured to be disabled in the mode register control mode.

6. The memory buffer of claim 1, wherein the memory buffer is configured to enter the parallel test mode when the first chip selecting signal and the second chip selecting signal are enabled, and output signals of the memory buffer corresponding to the first chip selecting signal and the second chip selecting signal are enabled.

7. The memory buffer of claim 1, wherein the memory buffer is configured to enter the mode register control mode when the first chip selecting signal and the second chip selecting signal are enabled, and output signals of the memory buffer corresponding to the first chip selecting signal and the second chip selecting signal are disabled.

8. The memory buffer of claim 1, wherein the control circuit includes:
   a NOR gate for performing a logical NOR operation with respect to the first chip selecting signal and the second chip selecting signal;
   a NAND gate for performing a logical NAND operation with respect to the row address strobe signal, the column address strobe signal, and the write enable signal; and
   an AND gate for performing a logical AND operation with respect to an output signal of the NOR gate, and an output signal of the NAND gate to generate the mode control signal.

9. A memory module, comprising:
   a substrate;
   a plurality of semiconductor memory devices, each mounted on a surface of the substrate and configured to operate in response to a command and an address signal and a data signal; and
   a memory buffer configured to select a mode from modes including a parallel test mode and a mode register control mode based at least on a first chip selecting signal and a second chip selecting signal received simultaneously.

10. The memory module of claim 9, wherein the memory buffer includes:
    a circuit configured to select one of the parallel test mode and the mode register control mode based on the first chip selecting signal, the second chip selecting signal, the row address signal, the column address signal, and the write enable signal.

11. The memory module of claim 10, wherein:
    the memory buffer is configured to enter the parallel test mode when the first chip selecting signal and the second chip selecting signal are enabled, and the row address strobe signal, the column address strobe signal, or the write enable signal is enabled; and
    the memory buffer is configured to enter the mode register control mode when the first chip selecting signal and the second chip selecting signal are enabled, and the row address strobe signal, the column address strobe signal, and the write enable signal are disabled.

12. The memory module of claim 10, wherein the circuit further comprises:

a NOR gate for performing a logical NOR operation with respect to the first chip selecting signal and the second chip selecting signal;

a NAND gate for performing a logical NAND operation with respect to the row address strobe signal, the column address strobe signal, and the write enable signal; and an AND gate for performing a logical AND operation with respect to an output signal of the NOR gate, and an output signal of the NAND gate.

13. A memory module comprising:

a substrate;

a plurality of semiconductor memory devices, each mounted on a surface of the substrate and configured to operate in response to a command and an address signal and a data signal;

a memory buffer configured to select a mode from modes including a parallel test mode and a mode register control mode based at least on a first chip selecting signal and a second chip selecting signal;

wherein the memory buffer includes:

a circuit configured to select one of the parallel test mode and the mode register control mode based on the first chip selecting signal, the second chip selecting signal, the row address signal, the column address signal, and the write enable signal;

wherein:

the memory buffer is configured to enter the parallel test mode when the first chip selecting signal and the second chip selecting signal are enabled, and the row address strobe signal, the column address strobe signal, or the write enable signal is enabled; and the memory buffer is configured to enter the mode register control mode when the first chip selecting signal and the second chip selecting signal are enabled, and the row address strobe signal, the column address strobe signal, and the write enable signal are disabled; and a plurality of ranks which are tested simultaneously in the parallel test mode.

14. A memory system, comprising:

a memory controller configured to generate a first chip selecting signal, a second chip selecting signal, a row address strobe signal, a column address strobe signal and a write enable signal;

a memory buffer configured to generate a mode control signal based on the first chip selecting signal, the second chip selecting signal, the row address strobe signal, the column address strobe signal, and the write enable signal, and to select a mode from modes including a parallel test mode and a mode register control mode in response to the mode control signal; and a memory module including semiconductor memory devices that operate in response to the parallel test mode and the mode register control mode, wherein the memory buffer is configured to enter the parallel test mode when the first chip selecting signal and the second chip selecting signal are enabled, and the row address strobe signal, the column address strobe signal, or the write enable signal is enabled.

15. The memory system of claim 14, wherein the memory buffer is configured to enter the mode register control mode when the first chip selecting signal and the second chip selecting signal are enabled, and the row address strobe signal, the column address strobe signal, and the write enable signal are disabled.

16. A method of setting a mode of a memory module, comprising:

simultaneously inputting a first chip selecting signal, a second chip selecting signal, a row address strobe signal, a column address strobe signal, and a write enable signal to a logic circuit;

outputting one or more output signals from the logic circuit, based on the first chip selecting signal, the second chip selecting signal, the row address strobe signal, the column address strobe signal, and the write enable signal; and selecting between a parallel test mode and a mode register control mode in response to the one or more output signals.

17. The method of claim 16, wherein the generating of the one or more output signals includes outputting a mode control signal generated by:

performing a logical NOR operation with respect to the first chip selecting signal and the second chip selecting signal to generate a first output signal;

performing a logical NAND operation with respect to the row address strobe signal, the column address strobe signal, and the write enable signal to generate a second output signal; and performing a logical AND operation with respect to the first output signal and the second output signal to generate the mode control signal.

18. The method of claim 16, further comprising entering the parallel test mode when the first chip selecting signal and the second chip selecting signal are enabled, and the row address strobe signal, the column address strobe signal, or the write enable signal is enabled.

19. The method of claim 16, further comprising entering the mode register control mode when the first chip selecting signal and the second chip selecting signal are enabled, and the row address strobe signal, the column address strobe signal, and the write enable signal are disabled.

* * * * *